US009825051B2

(12) United States Patent
Rabkin et al.

(10) Patent No.: US 9,825,051 B2
(45) Date of Patent: Nov. 21, 2017

(54) THREE DIMENSIONAL NAND DEVICE CONTAINING FLUORINE DOPED LAYER AND METHOD OF MAKING THEREOF

(71) Applicant: SanDisk Technologies, Inc., Plano, TX (US)

(72) Inventors: Peter Rabkin, Cupertino, CA (US); Jayavel Pachamuthu, San Jose, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/521,050

(22) Filed: Oct. 22, 2014

(65) Prior Publication Data

US 2016/0118396 A1    Apr. 28, 2016

(51) Int. Cl.
*H01L 27/115* (2017.01)
*H01L 27/11582* (2017.01)
(Continued)

(52) U.S. Cl.
CPC .... *H01L 27/11582* (2013.01); *H01L 21/0214* (2013.01); *H01L 21/0217* (2013.01); *H01L 21/28282* (2013.01); *H01L 27/1157* (2013.01); *H01L 27/11524* (2013.01); *H01L 27/11556* (2013.01); *H01L 29/167* (2013.01); *H01L 29/42364* (2013.01); *H01L 29/51* (2013.01); *H01L 29/518* (2013.01); *H01L 29/7883* (2013.01); *H01L 21/0228* (2013.01); *H01L 21/0234* (2013.01); *H01L 21/02131* (2013.01); *H01L 21/02178* (2013.01);
(Continued)

(58) Field of Classification Search
CPC ......... H01L 27/11582; H01L 27/11553; H01L 27/11556; H01L 27/1158; H01L 27/11578; H01L 27/1157; H01L 29/7926
See application file for complete search history.

(56) References Cited

U.S. PATENT DOCUMENTS 5,915,167 A    6/1999  Leedy
6,191,463 B1 *  2/2001  Mitani .............. H01L 21/28176
                                                    257/410
(Continued)

OTHER PUBLICATIONS

International Searching Authority, Invitation to Pay Additional Fees and Partial International Search for PCT/US2015/051261, dated Dec. 2, 2015, 7 pages.
(Continued)

*Primary Examiner* — Abul Kalam
(74) *Attorney, Agent, or Firm* — The Marbury Law Group PLLC

(57) ABSTRACT

A method of making a monolithic three dimensional NAND string comprising forming a stack of alternating layers of a first material and a second material different from the first material over a substrate, forming an at least one front side opening in the stack and forming at least a portion of a memory film in the at least one front side opening. The method also includes forming a semiconductor channel in the at least one front side opening and doping at least one of the memory film and the semiconductor channel with fluorine in-situ during deposition or by annealing in a fluorine containing atmosphere.

12 Claims, 14 Drawing Sheets

(51) Int. Cl.
| | |
|---|---|
| *H01L 21/28* | (2006.01) |
| *H01L 27/11524* | (2017.01) |
| *H01L 27/11556* | (2017.01) |
| *H01L 27/1157* | (2017.01) |
| *H01L 29/167* | (2006.01) |
| *H01L 29/423* | (2006.01) |
| *H01L 29/51* | (2006.01) |
| *H01L 29/788* | (2006.01) |
| *H01L 21/02* | (2006.01) |

(52) U.S. Cl.
CPC .. *H01L 21/02274* (2013.01); *H01L 21/02321* (2013.01); *H01L 21/02326* (2013.01); *H01L 21/02337* (2013.01)

(56) References Cited

U.S. PATENT DOCUMENTS

| | | | |
|---|---|---|---|
| 6,445,030 B1 | 9/2002 | Wu et al. | |
| 2006/0284241 A1 | 12/2006 | Kim | |
| 2009/0045452 A1* | 2/2009 | Lue | G11C 16/0466 257/321 |
| 2011/0147801 A1* | 6/2011 | Shim | H01L 27/11551 257/211 |
| 2011/0256707 A1* | 10/2011 | Pachamuthu | H01L 21/28273 438/593 |
| 2011/0298037 A1* | 12/2011 | Choe | G11C 16/0483 257/324 |
| 2011/0306195 A1* | 12/2011 | Kim | H01L 27/11578 438/591 |
| 2012/0001247 A1* | 1/2012 | Alsmeier | H01L 27/11551 257/316 |
| 2012/0001249 A1* | 1/2012 | Alsmeier | H01L 27/11551 257/319 |
| 2012/0156848 A1* | 6/2012 | Yang | H01L 27/11529 438/287 |
| 2012/0241841 A1 | 9/2012 | Mizushima et al. | |
| 2013/0095622 A1* | 4/2013 | Jee | H01L 29/7889 438/264 |
| 2013/0161725 A1* | 6/2013 | Park | H01L 29/7926 257/324 |
| 2013/0248974 A1* | 9/2013 | Alsmeier | G11C 16/04 257/321 |
| 2013/0313627 A1* | 11/2013 | Lee | H01L 21/76816 257/324 |
| 2014/0295636 A1 | 10/2014 | Makala et al. | |

OTHER PUBLICATIONS

Chang, T. Y. et al., "Effect of $CF_4$ Plasma Pretreatment on Low Temperature Oxides," IEEE Transactions on Electron Devices, vol. 49, No. 12, pp. 2163-2170, (2002).

Hook, T. B. et al., "The Effects of Fluorine on Parametrics and Reliability in a 0.18-um 3.5/6.8 nm Dual Gate Oxide CMOS Technology," IEEE Transactions on Electron Devices, vol. 48, No. 7, pp. 1346-1353 (2001).

Wright, P. J. et al., "The Effect of Fluorine in Silicon Dioxide Gate Dielectrics," IEEE Transactions on Electron Devices, vol. 36, No. 5, pp. 879-889 (1989).

Kim, C-H et al., "Excimer-Laser-Induced In-Situ Fluorine Passivation Effects on Polycrystalline Silicon Thin Film Transistors," Jpn. J. Appl. Phys., vol. 38, Part 1, No. 4B, pp. 2247-2250, (1999).

Endoh et al., "Novel Ultra High Density Memory with a Stacked-Surrounding Gate Transistor (S-SGT) Structured Cell," IEDM Proc. (2001) 33-36.

U.S. Appl. No. 14/133,979, filed Dec. 19, 2013, SanDisk Technologies Inc.

International Preliminary Report on Patentability and Written Opinion from the International Bureau for International Patent Application No. PCT/US2015/051261, dated May 4, 2017, 11 pages.

\* cited by examiner

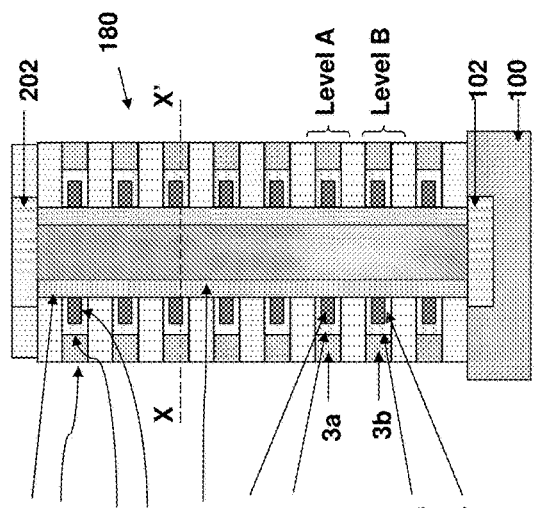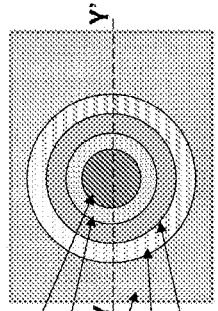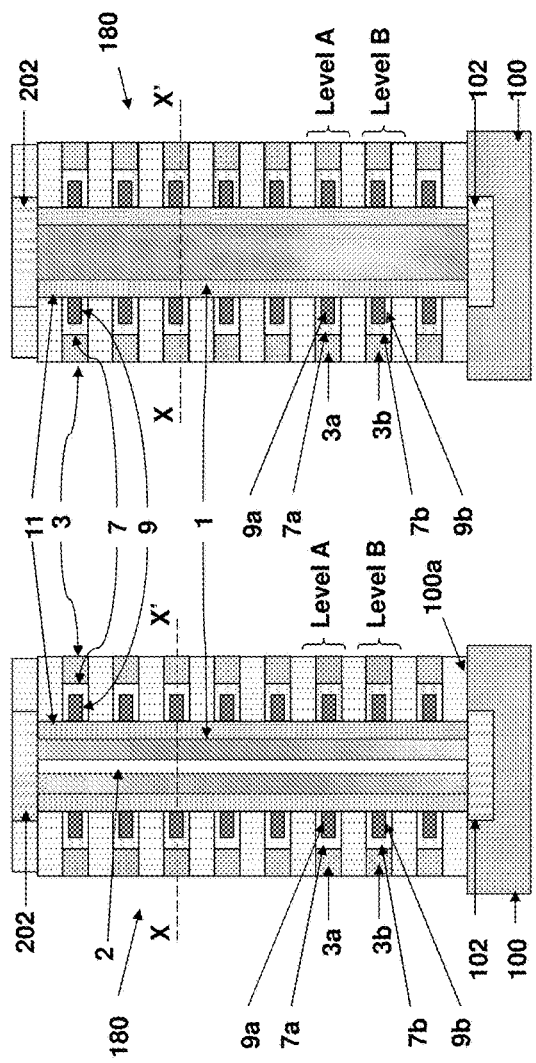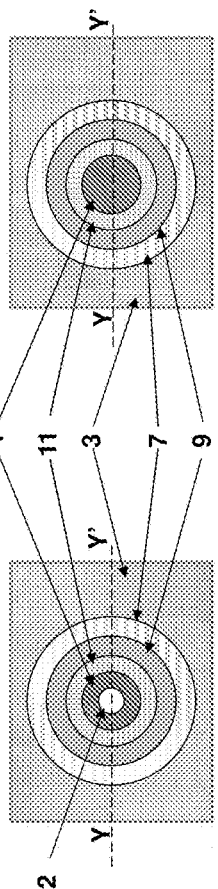

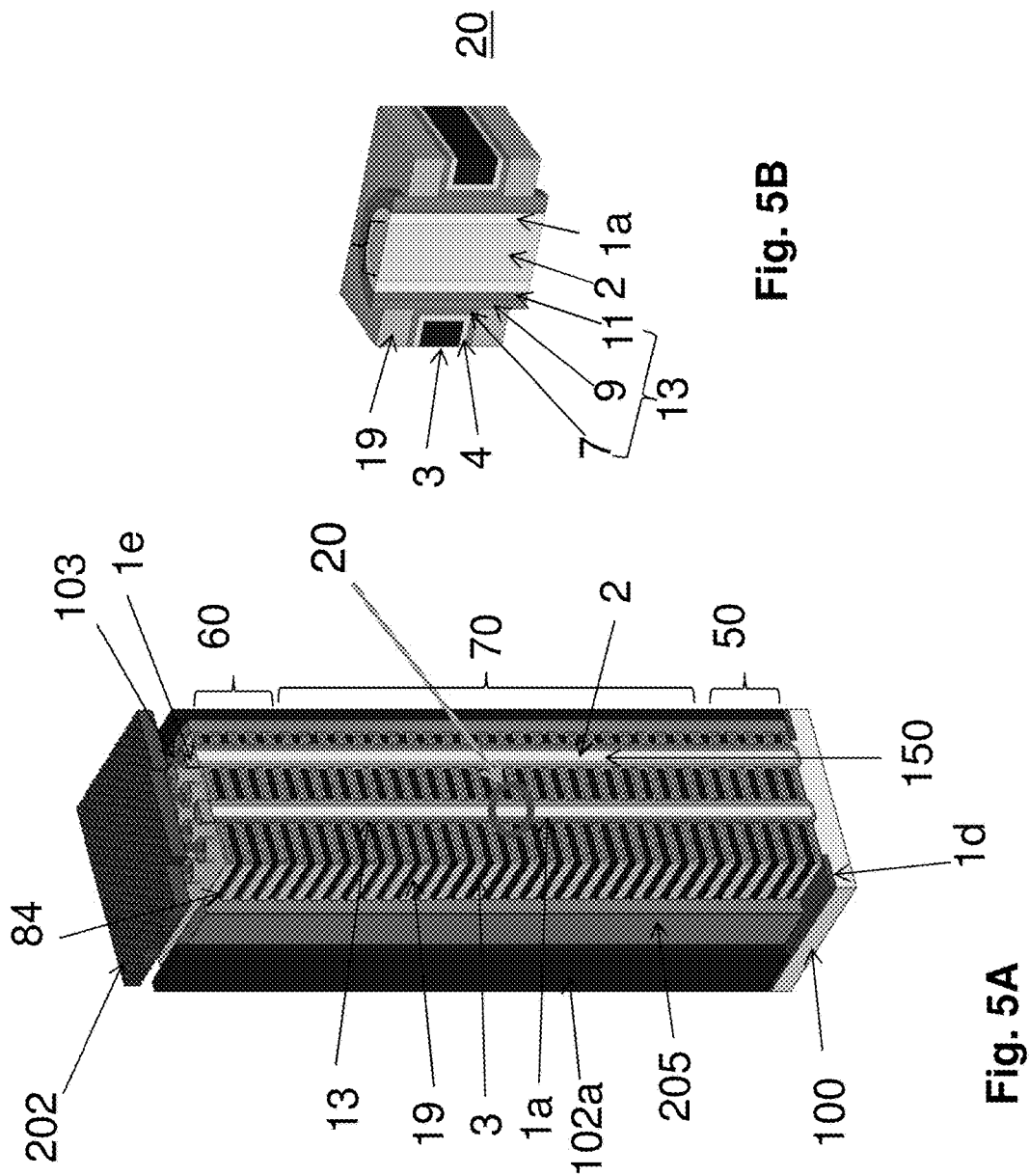

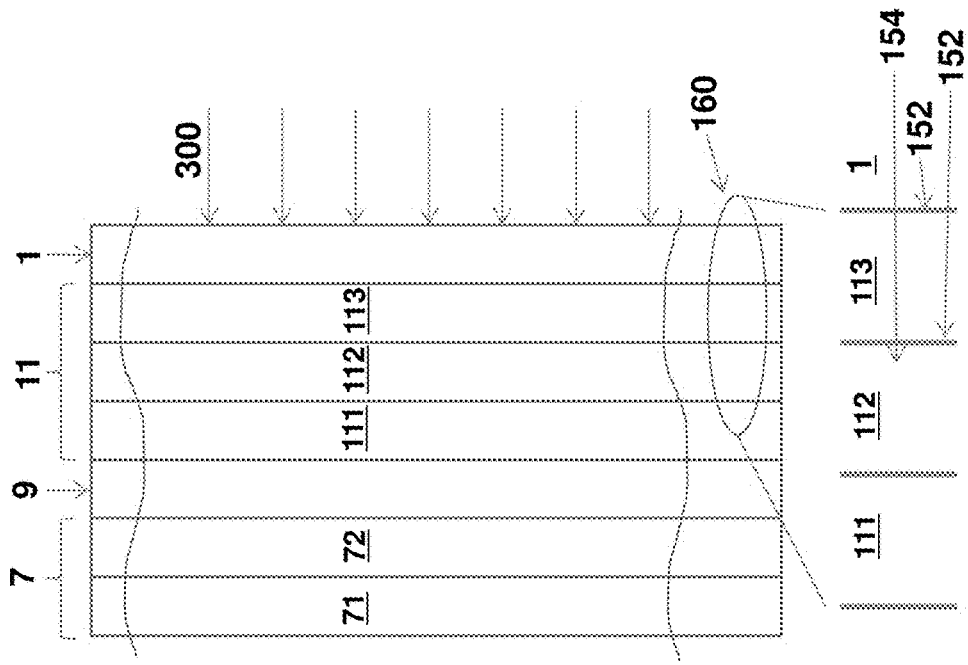
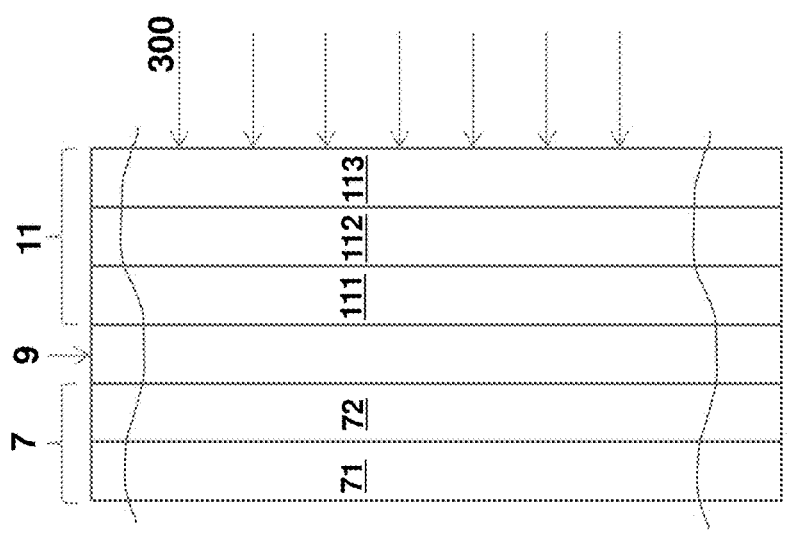

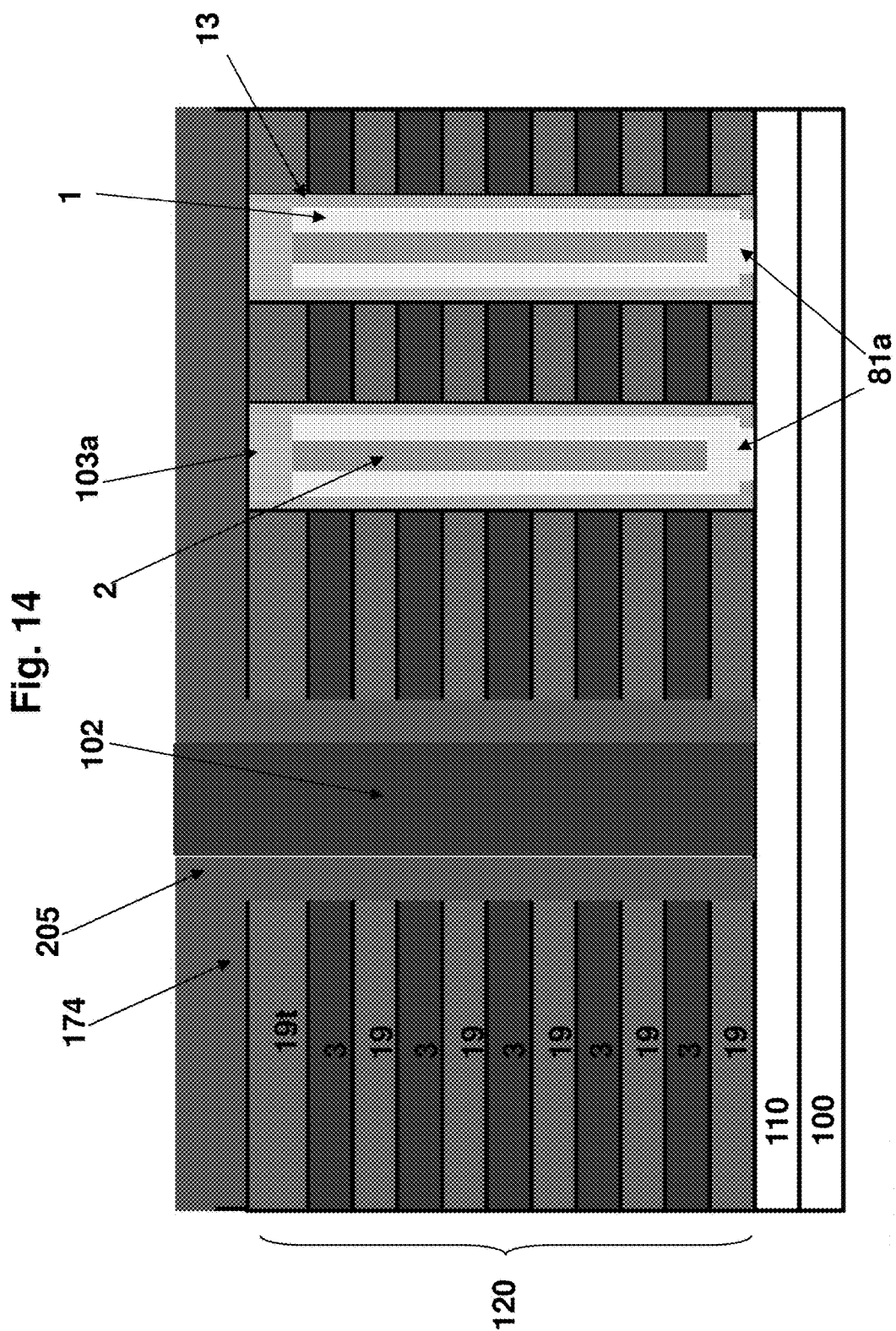

1

THREE DIMENSIONAL NAND DEVICE CONTAINING FLUORINE DOPED LAYER AND METHOD OF MAKING THEREOF

FIELD

The present disclosure relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

An embodiment relates to a monolithic three dimensional NAND string including a semiconductor channel, at least one end part of the semiconductor channel extending substantially perpendicular to a major surface of a substrate and a plurality of control gate electrodes extending substantially parallel to the major surface of the substrate. The plurality of control gate electrodes include at least a first control gate electrode located in a first device level and a second control gate electrode located in a second device level located over the major surface of the substrate and below the first device level. The first control gate electrode is separated from the second control gate electrode by an insulating layer located between the first and second control gates. The NAND string also includes a blocking dielectric located adjacent the plurality of control gate electrodes, at least one charge storage region located adjacent the blocking dielectric and a tunnel dielectric located between the at least one charge storage region and the semiconductor channel. At least one of the semiconductor channel, blocking dielectric or tunnel dielectric is doped with fluorine.

Another embodiment relates to a method of making a monolithic three dimensional NAND string comprising forming a stack of alternating layers of a first material and a second material different from the first material over a substrate, forming an at least one front side opening in the stack and forming at least a portion of a memory film in the at least one front side opening. The method also includes forming a semiconductor channel in the at least one front side opening and doping at least one of the memory film and the semiconductor channel with fluorine in-situ during deposition or by annealing in a fluorine containing atmosphere.

BRIEF DESCRIPTION OF THE DRAWINGS

FIGS. 1A and 1B are respectively side cross sectional and top cross sectional views of a NAND string. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of another NAND string. FIG. 2A is a side cross sectional view of the device along line Y-Y' in FIG. 2B, while FIG. 2B is a side cross sectional view of the device along line X-X' in FIG. 2A.

FIG. 4B is a side cross sectional view of the device along line B-B' in FIG. 4A, while FIG. 4C is a side cross sectional view of the device along line W-W' in FIG. 4A.

FIG. 5A is a cut-away, three dimensional perspective of the device of FIGS. 4A-4C, but with the optional lower semiconductor pillar omitted. FIG. 5B is a close up, cross sectional view of one memory cell of FIG. 5A.

FIGS. 6A-6C are side cross sectional views of a portion of a NAND string according to an embodiment.

FIGS. 7 to 14 illustrate a method of forming metal replacement gates in the NAND strings of the previous embodiments.

DETAILED DESCRIPTION

Short term and long term data retention are useful parameters for NAND string memory devices. The inventors have realized that short term and long term data retention can be improved by doping one or more of the semiconductor channel, blocking dielectric or tunnel dielectric with fluorine. Fluorine passivates defects, such as dangling bonds and electronic traps located at both the interface between layers and inside the layers. Passivation of the tunnel dielectric and the blocking dielectric reduces charge leakage through these layers, resulting in better data retention and endurance. Passivation of the channel improves the channel quality, resulting in improved cell current and cell performance.

As discussed in more detail below, in an embodiment, the concentration of fluorine atoms can be in the range of $1 \times 10^{17}$ to $1 \times 10^{21}$ cm$^{-3}$. In an alternative embodiment, the fluorine concentration may be in the range of 0.1-5 atomic percent (at %). As discussed in more detail below, the tunnel dielectric may be a dielectric film that includes a layer of silicon nitride or silicon oxynitride between a first layer of silicon oxide and a second layer of silicon oxide. Either the first layer of silicon oxide, the second layer of silicon oxide, both the first and second layers of silicon oxide are doped with fluorine. Additionally, the blocking dielectric may be a dielectric film that includes a layer of a metal oxide, such as $Al_2O_3$ and a layer of silicon oxide. Either the layer of $Al_2O_3$, the layer of silicon oxide or both the layer of $Al_2O_3$ and the layer of silicon oxide may be doped with fluorine.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
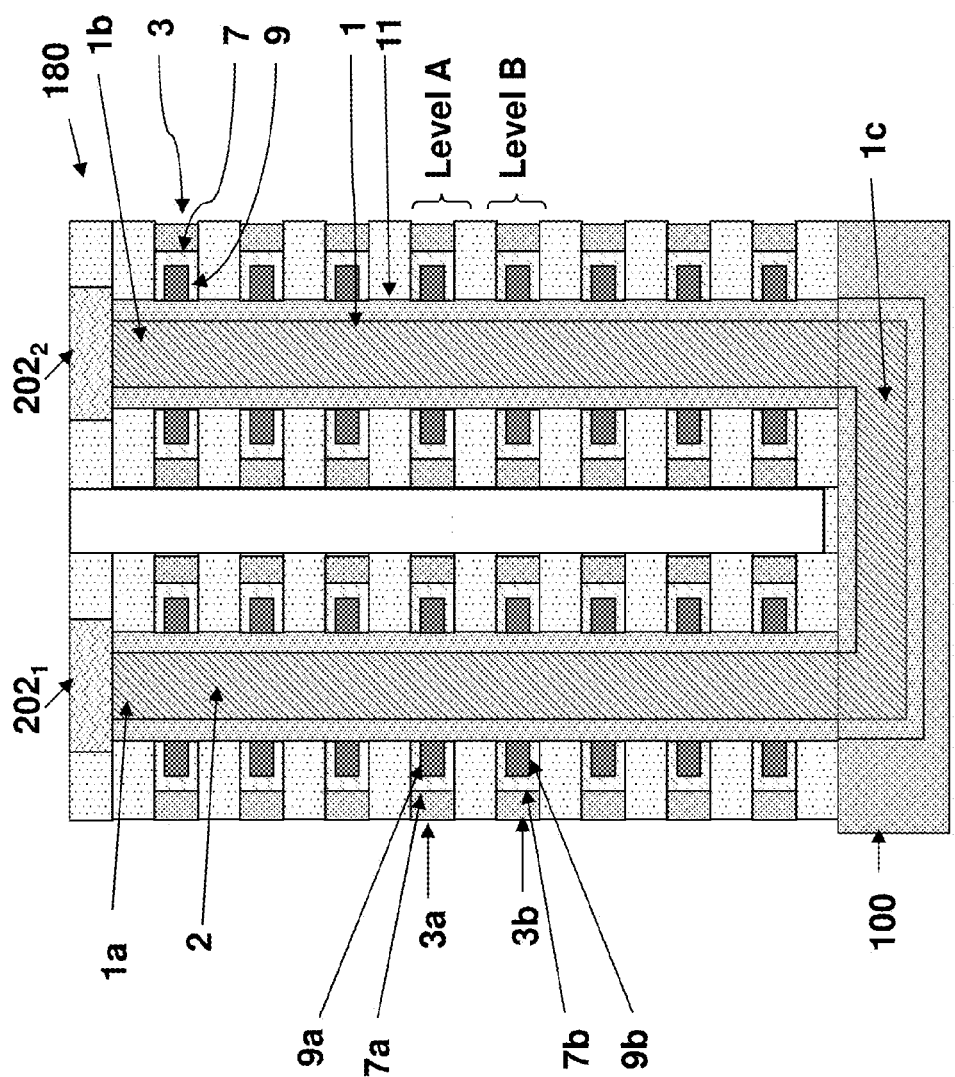
FIG. 3A is a side cross sectional view of a conventional NAND string with a U-shaped channel.
Figure 3B:
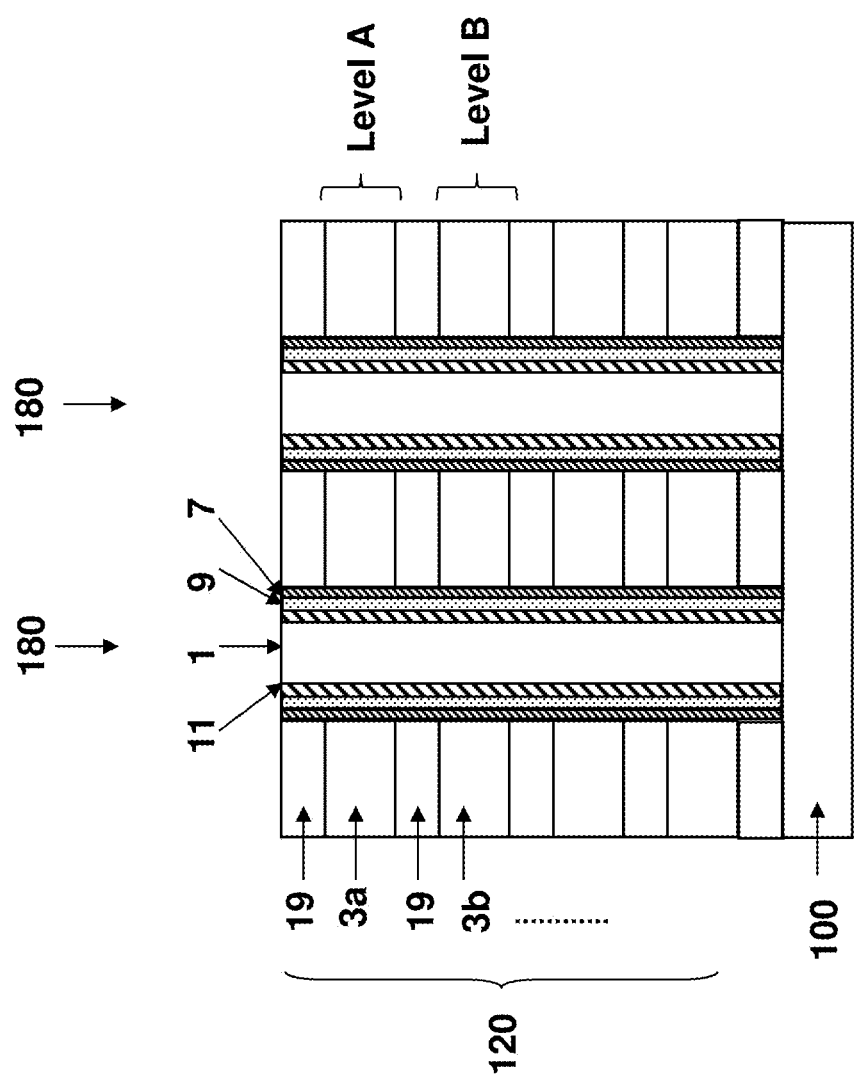
FIG. 3B is a side cross sectional view of another NAND string.

In some embodiments, the monolithic three dimensional NAND string 150 comprises a semiconductor channel 1 having at least one end portion extending substantially perpendicular to a major surface 100a of a substrate 100, as shown in FIGS. 1A, 2A, 3A, 3B, 4B and 4C. "Substantially perpendicular to" (or "substantially parallel to") means within 0-10°. For example, the semiconductor channel 1 may have a pillar shape and the entire pillar-shaped semiconductor channel extends substantially perpendicularly to the major surface of the substrate 100, as shown in FIGS. 1A, 2A and 3B. In these embodiments, the source/drain electrodes of the device can include a lower electrode 102 provided below the semiconductor channel 1 and an upper electrode 202 formed over the semiconductor channel 1, as shown in FIGS. 1A and 2A.

Alternatively, the semiconductor channel 1 may have a U-shaped pipe shape, as shown in FIG. 3A. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. The NAND string's select or access transistors are not shown in FIGS. 1A-4C for clarity. However, the source side select transistor 50 and drain side select transistor 60 are shown in FIG. 5A. These transistors may have one select gate or plural select gates as shown in FIG. 5A.

In some embodiments, the semiconductor channel 1 may be a filled feature, as shown in FIGS. 2A and 2B. In some other embodiments, the semiconductor channel 1 may be hollow, for example a hollow cylinder filled with an insulating fill material 2 (e.g., core dielectric), as shown in FIGS. 1A-1B, 3B, 4B and 4C. In these embodiments, an insulating fill material 2 may be formed to fill the hollow part surrounded by the semiconductor channel 1.

Figure 4A:
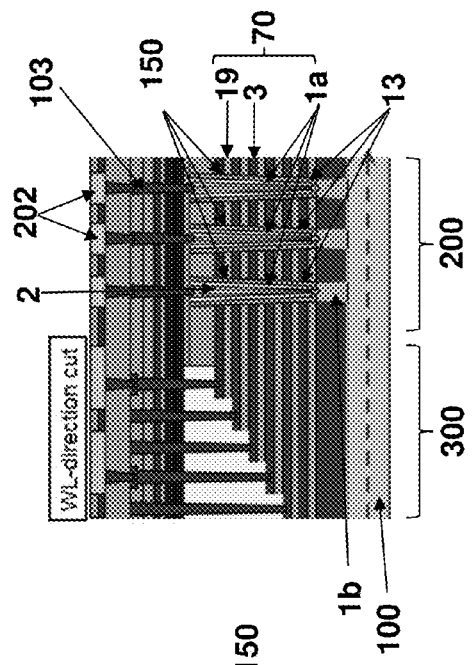
FIG. 4A is a top cross sectional view of a memory block of an embodiment of the invention.
Figure 4B:
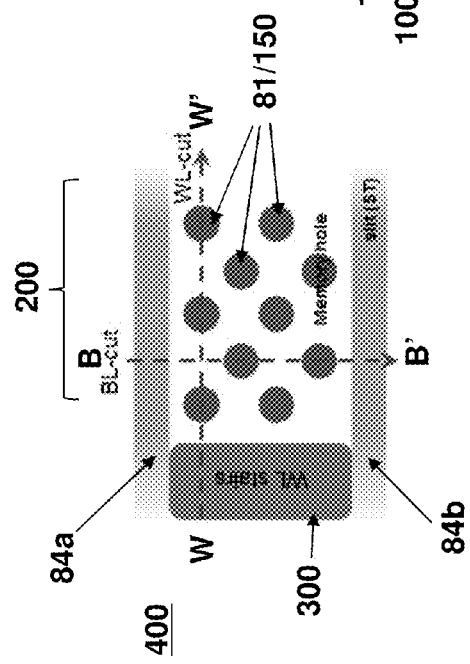
FIGS. 4B and 4C are side cross sectional views of the memory block of FIG. 4A along the bit line and word line directions, respectively.
Figure 4C:
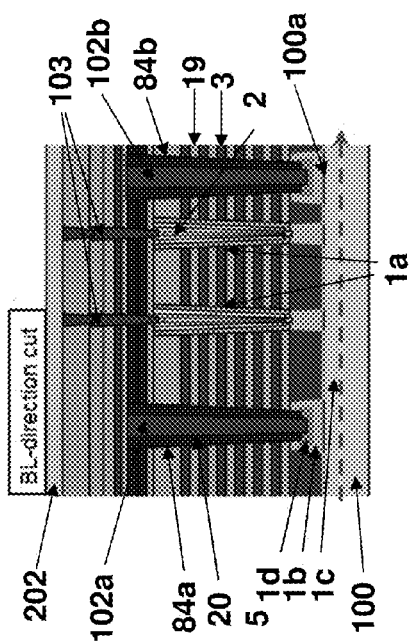

FIGS. 4A to 4C illustrate a memory block 400 containing an array of a plurality of vertical NAND strings 150 according to another embodiment of the invention. Each string includes the memory device levels 70, respectively, as shown in FIG. 4C. FIGS. 4A and 4C show the location of memory region 200 and the stepped word line contact region 300. FIG. 5A shows a three dimensional view of the device of FIGS. 4A-4C (with the silicon pillar 1b under the source 1d and the silicon pillar 1b under channel portion 1a omitted) and FIG. 5B shows a close up of one memory cell 20 of the device of FIG. 5A.

A first source electrode 102a is located in the first dielectric filled trench 84a and a second source electrode 102b is located in the second dielectric filled trench 84b in each block 400, as shown in FIGS. 4A, 4B and 5A. In the memory device levels 70, the dielectric fill in the trench 84 may comprise any suitable insulating layer 205, such as silicon oxide, etc., which is located on both walls of the trench 84. The source electrode 102 is located in the middle of the trench 84 and is separated from the control gate electrodes 3 by the insulating layer 205, as shown in FIGS. 4B and 5A. Drain electrodes (e.g., bit lines) 202 and drain lines 103 are located over the NAND memory cell region in memory device levels 70.

Each NAND string 150 contains a NAND memory cell region in the memory device levels 70 which includes the semiconductor channel 1 which contains a portion 1a which extends substantially perpendicular to the major surface 100a of the substrate 100. A bottom portion 1c of the channel 1 is located in or over the major surface 100a of the substrate 100, and extends toward the doped source region 1d substantially parallel to the major surface of the substrate. A drain region 1e is located in the upper part of the channel portion 1a in contact with a respective drain line 103, as shown in FIG. 5A. An optional semiconductor pillar may form an optional vertical portion 1b of the channel which extends substantially perpendicular to the major surface 100a of the substrate 100 and which contacts the source region 1d. The source region 1d may be located in the pillar above portion 1b of the channel or in the major surface 100a of the substrate.

The device contains a plurality of control gate electrodes 3 that extend substantially parallel to the major surface 100a of the substrate 100 in the memory device levels 70 from the memory region 200 to the stepped word line contact region 300. The portions of the control gate electrodes 3 which extend into region 300 may be referred to as "word lines" herein. The drain electrode (e.g., bit line) 202 electrically contacts an upper portion of the semiconductor channel 1 via drain lines 103.

Furthermore, each NAND string 150 contains at least one memory film 13 which is located adjacent to the semiconductor channel 1 (e.g., at least next to portion 1a of the channel) in the memory device levels 70, as shown in FIG. 4C. Specifically, the memory film 13 is located between the semiconductor channel 1 and the plurality of control gate electrodes 3. Each memory cell 20 includes a portion of the channel 1a, a control gate electrode 3 and a portion of the memory film 13, as shown in FIGS. 5A and 5B. The memory film 13 contains the tunnel dielectric 11, the charge storage region(s) 9 (e.g., a charge trapping layer or floating gates), and the blocking dielectric 7, as shown in FIG. 5B. Each part of the memory film 13, such as the tunnel dielectric 11, the charge storage region 9, and/or the blocking layer 7 may be comprised of one or more layers (e.g., one or more dielectric layers) made of different materials.

As shown in FIG. 4C, the control gate electrodes 3 extend in the word line direction W-W' which is perpendicular to the bit line direction B-B'. The control gate electrodes 3 are continuous in the array in the memory block 400. In other words, the control gate electrodes 3 have a shape of a continuous strip or sheet with discrete openings 81 (which are referred to herein as front side openings or memory openings) which contain the NAND strings 150. However, the control gate electrodes 3 have electrical and physical continuity in the bit line direction between the trenches 84 and in the word line direction throughout the block 400. In other words, the memory openings 81 do not completely sever the continuous electrical and physical path in the control gate electrodes from one trench 84 to the opposite trench 84 in each block. Thus, the memory block 400 is a portion of a device between two successive trenches 84 that contains a common control gate electrode 3 in each of the plurality of memory device levels 70 for plural rows of NAND strings.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A to 4C. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof. For example, the control gate material in FIGS. 1A, 2A, 3A, 4B and 4C may comprise a conductive metal or metal alloy, such as tungsten and/or titanium nitride, while the control gate material in FIG. 3 may comprise doped polysilicon.

A blocking dielectric 7 is located adjacent to the control gate(s) 3 and may surround the control gate electrodes 3, as shown in FIGS. 1A, 2A and 3A. Alternatively, a straight blocking dielectric layer 7 may be located only adjacent to an edge (i.e., minor surface) of each control gate electrode 3, as shown in FIG. 3B. The blocking dielectric 7 may comprise a layer having plurality of blocking dielectric segments located in contact with a respective one of the plurality of control gate electrodes 3, for example a first blocking dielectric segment 7a located in device level A and a second blocking dielectric segment 7b located in device level B are in contact with control electrodes 3a and 3b, respectively, as shown in FIG. 3A. Alternatively, the blocking dielectric 7 may be a straight, continuous layer, as shown in FIG. 3B, similar to the device described in U.S. Pat. No. 8,349,681 issued on Jan. 8, 2013 and incorporated herein by reference in its entirety.

The monolithic three dimensional NAND string also comprise a charge storage region 9. The charge storage region 9 may comprise one or more continuous layers which extend the entire length of the memory cell portion of the NAND string, as shown in FIG. 3. For example, the charge storage region 9 may comprise an insulating charge trapping material, such as a silicon nitride layer.

Alternatively, the charge storage region may comprise a plurality of discrete charge storage regions 9, as shown in FIGS. 1A, 2A and 3A. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers) or high-k materials such as aluminum oxide, hafnium oxide or combinations thereof.

The blocking dielectric 7, charge storage region(s) 9 and the tunnel dielectric 11 together is also referred to herein as a memory film 13, as shown in FIGS. 4B, 4C and 5B.

If desired, an optional barrier layer 4 may be located between the control gate electrode 3 and the blocking dielectric 7, as shown in FIG. 5B. The barrier layer 4 may comprise any suitable conductive barrier material, such as titanium nitride or tungsten nitride for tungsten control gate electrodes 3.

FIGS. 6A-6C illustrate side cross sectional views of a portion of a NAND string according to an embodiment.

In the embodiment illustrated in 6A, the blocking dielectric 7 comprises a first blocking dielectric 71 and a second blocking dielectric 72. In an embodiment, the first blocking dielectric 71 comprises a metal oxide layer, such as an $Al_2O_3$ layer and the second blocking dielectric 72 comprises a silicon oxide (e.g., $SiO_2$) layer. The first blocking dielectric 71 is located adjacent to the control gate electrodes 3 and the second blocking dielectric 72 is located adjacent to the charge storage region 9. In an embodiment, the charge storage region 9 comprises a charge trapping material, such as silicon nitride. In an embodiment, the tunnel dielectric 11 comprises a tunnel dielectric film comprising a silicon nitride (e.g., $Si_3N_4$) or silicon oxynitride (SiON) layer 112 located between a first silicon oxide (e.g., $SiO_2$) layer 111 and a second silicon oxide (e.g., $SiO_2$) layer 113. The semiconductor channel 1 is formed over the tunnel dielectric 11, as illustrated in FIG. 6B, such as over layer 113, while layer 111 is located over the charge storage region 9.

In an embodiment, at least one of the semiconductor channel 1, blocking dielectric 7 or tunnel dielectric 11 is doped with fluorine. In an embodiment, the semiconductor channel 1, the blocking dielectric 7 and the tunnel dielectric 11 are doped with fluorine. In an embodiment, the blocking dielectric 7 comprises a first blocking dielectric 71 comprising the $Al_2O_3$ layer doped with fluorine and a second blocking dielectric 72 comprising a silicon oxide layer doped with fluorine. Alternatively, either the first blocking dielectric 71 or the second blocking dielectric 72 is doped with fluorine. In an embodiment, the tunnel dielectric 11 comprises a dielectric film as described above and either the first silicon dioxide layer 111 or the second silicon dioxide 113 layer is doped with fluorine. In another embodiment, the tunnel dielectric 11 comprises a dielectric film as described above and both the first silicon dioxide layer 111 and the second silicon dioxide 113 layer are doped with fluorine.

In an embodiment, at least one of the semiconductor channel 1, blocking dielectric 7 or tunnel dielectric 11 is formed in an atmosphere comprising fluorine. In an embodiment, the tunnel dielectric 11 (e.g., layer 113) may be formed by an in-situ steam generated (ISSG) process. In this process, the atmosphere may comprise, but is not limited to, one or more of fluorine containing precursor vapors, such as hydrofluoric acid, fluorosilicic acid or difluorosilane, in addition to the steam generated from hydrogen and oxygen precursors. In an alternative embodiment of the method, the tunnel dielectric 11 may be formed be plasma enhanced chemical vapor deposition (PEVCD) at 350-450° C. using an atmosphere including tetraethoxysilane (TEOS), $O_2$ and a fluorine containing gas, such as $C_2F_6$. Alternatively, the tunnel dielectric 11 may be formed by atomic layer deposition (ALD) at 400-500° C. in an atmosphere including a fluorine containing gas, such as $C_2F_6$. The blocking dielectric 7 and the channel 1 may be formed with similar processing as the tunnel dielectric. In an embodiment, the tunnel dielectric 11, blocking dielectric 7 and/or the semiconductor channel 1 are doped with fluorine during formation (i.e. in-situ).

Alternatively, the tunnel dielectric 11, blocking dielectric 7 and/or semiconductor channel 1 may be formed essentially fluorine free and doped with fluorine after formation. In this embodiment, the tunnel dielectric 11, blocking dielectric 7 and/or semiconductor channel 1 is exposed to a fluorine containing atmosphere 300 (e.g. $C_2F_6$ ambient or $CF_4$ plasma) and then one or more annealing steps performed to diffuse the fluorine dopant into the tunnel dielectric 11, blocking dielectric 7 and/or the semiconductor channel 1. In an embodiment, the fluorine concentration is in a range of 0.1 at %-5 at %. In an alternative embodiment, the fluorine concentration is in a range of $1\times10^{17}$-$1\times10^{21}$ $cm^{-3}$. In other embodiments, the fluorine concentrations, in terms of atomic percentage or atomic concentration per unit volume can be higher or lower.

FIG. 6C is a close up of a portion 160 of the side cross sectional view illustrated in FIG. 6B. As illustrated in FIG. 6C, the fluorine can bond with silicon or nitrogen, forming Si—F bonds 152 and N—F bonds 154, respectively. Bonding at the interface between layers (i.e. at the surfaces of the layers), for example between the charge storage regions 9 and the tunnel dielectric 11 or between the tunnel dielectric 11 and the semiconductor channel 1, passivates interface dangling bonds. Additionally, fluorine passivates traps, such as interface and bulk traps. For example, fluorination improves the quality of the semiconductor channel 1 by passivating traps at semiconductor channel 1—tunnel dielectric 11 interface and within semiconductor channel 1. The passivation of interface dangling bonds, interface traps and bulk traps reduces electron leakage through the blocking dielectric 7 and the tunnel dielectric 11 resulting in better data retention and endurance. Additionally, passivating defects in semiconductor channel may result in higher carrier mobility, hence higher cell current, and ultimately better device performance. In an embodiment, the fluorine passivates at least one surface of the at least one of the semiconductor channel 1, blocking dielectric 7 or tunnel dielectric 11.

Figure 7:
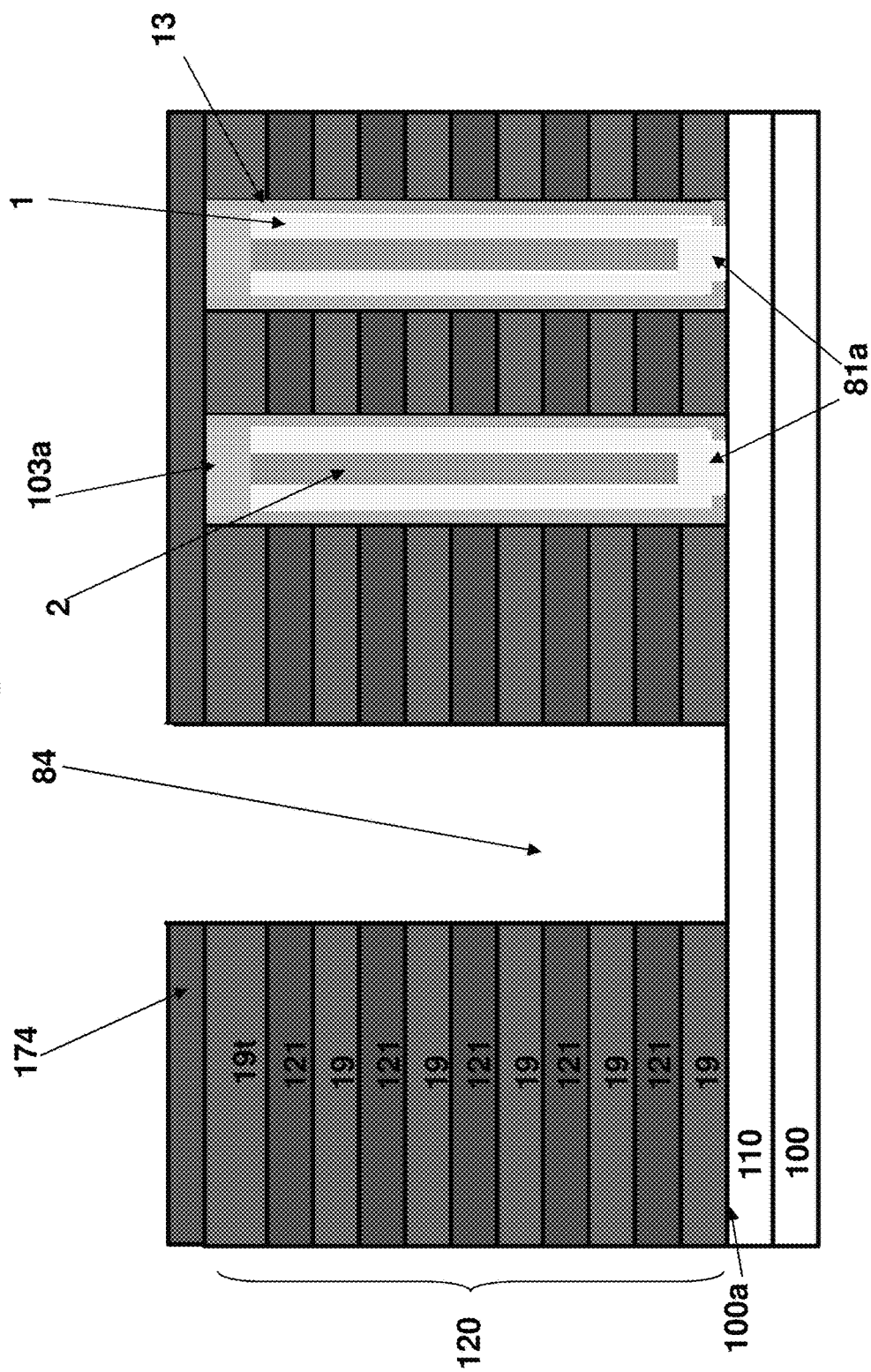

In a first embodiment of making monolithic three dimensional NAND strings 150, a stack 120 of alternating first material layers 19 and second material layers 121 is provided over a major surface 100a of a substrate 100, as shown in FIG. 7. The substrate 100 may contain a doped well region, such as a p-well 110 in its upper portion. The first material layers 19 comprise an insulating material and the second material layers 121 comprise sacrificial layers. In an embodiment, the first material layers 19 comprise silicon oxide and the second material layers 121 comprise polysilicon, amorphous silicon, or silicon nitride. Alternatively, the second material layers 121 may comprise doped semiconductor or electrically conductive control gate layers, similar to the embodiment shown in FIG. 3B.

If desired, a top insulating layer 19t may have a greater thickness and/or a different composition from the other insulating layers 19. For example, the top insulating layer 19t may comprise a cover silicon oxide layer made using a TEOS source while the remaining layers 19 may comprise thinner silicon oxide layers may using a different source. The method includes forming front side openings 81 by RIE or another suitable etching method. The stack 120 includes a plurality of front side openings 81 (e.g. a plurality of cylindrical memory holes shown in FIG. 1B).

The next step includes forming at least a portion of the memory film 13 in the front side openings 81. For example, the tunnel dielectric 11 is formed in the front side opening 81. If desired, the blocking dielectric 7 and/or the charge storage region(s) 9 portions of the memory film 13 may also be formed in the front side openings 81 prior to forming the tunnel dielectric 11, such that the entire memory film 13 is formed in the front side openings 81. Thus, in this embodiment, the method include forming the blocking dielectric layer 7 in the front side openings 81, forming the at least one charge storage region 9 over the blocking dielectric layer 7 in the front side openings, and forming the tunnel dielectric layer 11 over the at least one charge storage region 9 in the front side openings. A semiconductor channel 1, the optional core dielectric 2 and the drain region 103a in the upper part of the channel are them formed over the memory film 13.

In an embodiment, forming at least a portion of a memory film 13 in the front side opening 81 comprises forming a first blocking dielectric 71 comprising $Al_2O_3$ in-situ doped with fluorine in the front side opening and further comprising forming a second blocking dielectric 72 comprising silicon oxide in-situ doped with fluorine in either the front side opening 81 or in the back side recesses 182 through the back side opening 84 prior to forming the control gate electrodes 3.

In an embodiment, the first layer 111 of silicon oxide of the tunnel dielectric 11 is located adjacent to the charge storage region 9 and the first layer 111 of silicon oxide is formed by either PECVD using TEOS, $O_2$ and $C_2F_6$ sources, or by ALD using a silicon containing precursor, an oxygen precursor and $C_2F_6$ sourced to form an in-situ doped first layer 111 of silicon oxide. In an embodiment, the second layer 113 of silicon oxide is located adjacent to the semiconductor channel 1 and the second layer 113 of silicon oxide is formed by either PECVD using TEOS, $O_2$ and $C_2F_6$ sources to form an in-situ doped second layer 113 of silicon oxide or by in-situ steam generation (ISSG) oxidation of a portion of the layer 112 of silicon nitride or silicon oxynitride in an ambient containing steam and at least one of hydrofluoric acid, fluoro silicic acid or difluorosilane.

In an embodiment, at least one of the channel 1, blocking dielectric 7 and/or the tunnel dielectric 11 are doped with fluorine by annealing in a $CF_4$ plasma after deposition. In an embodiment, the semiconductor channel comprises an amorphous silicon or polysilicon channel which is doped in-situ with fluorine or doped with fluorine by annealing in a $CF_4$ plasma after deposition.

FIG. 7 illustrates the device following the filling of the front side openings 81 and formation of a cover layer 174, such as a silicon oxide cover layer using a TEOS source. As shown in FIG. 7, the back side opening 84 (e.g., the slit trench shown in FIGS. 4A, 4B and 5) is then formed in the stack 120 by any suitable lithography and etching steps to expose a p-type doped well (p-well) 110 in the substrate 100.

Figure 8:
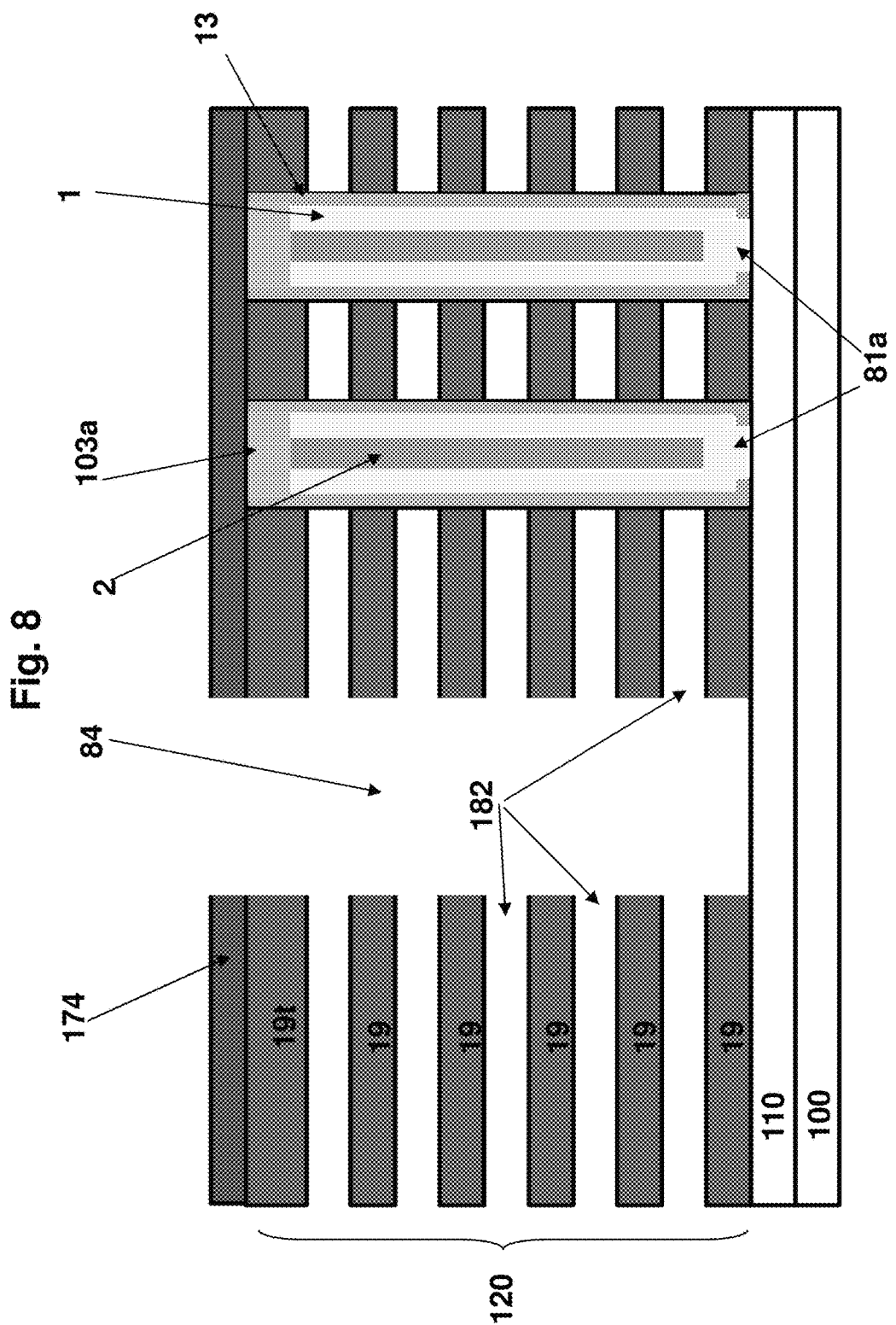

Then, at least a portion of the sacrificial second material layers 121 are removed through the back side openings 84 to form back side recesses 182 between the first material layers 19, as shown in FIG. 8. Layers 121 may be removed by selective etching, such as a silicon nitride selective etching which removes silicon nitride layers 121 but does not remove the silicon oxide layers 174, 19 or the silicon regions. The selective etch may stop on the oxide blocking dielectric, such as a silicon oxide blocking dielectric 7 which forms the outer part of the memory film 13.

Alternatively, the blocking dielectric 7 may be formed from the back side in the back side recesses 182 prior to the control gate electrodes 3. In this embodiment, forming the blocking dielectric layer comprises forming the blocking dielectric layer in the back side opening 84 and in the back side recesses 182.

If desired, the at least one charge storage region 9 may be formed through either the front side opening or the back side opening. Thus, the step of forming the at least one charge storage region 9 comprises at least one of forming the at least one charge storage region 9 prior to forming the blocking dielectric in the back side opening 84 or forming the at least one charge storage region 9 over the blocking dielectric 7 in the front side opening 81 or over the sidewall in the front side opening 81 (if the blocking dielectric is formed through the back side opening).

Figure 9:
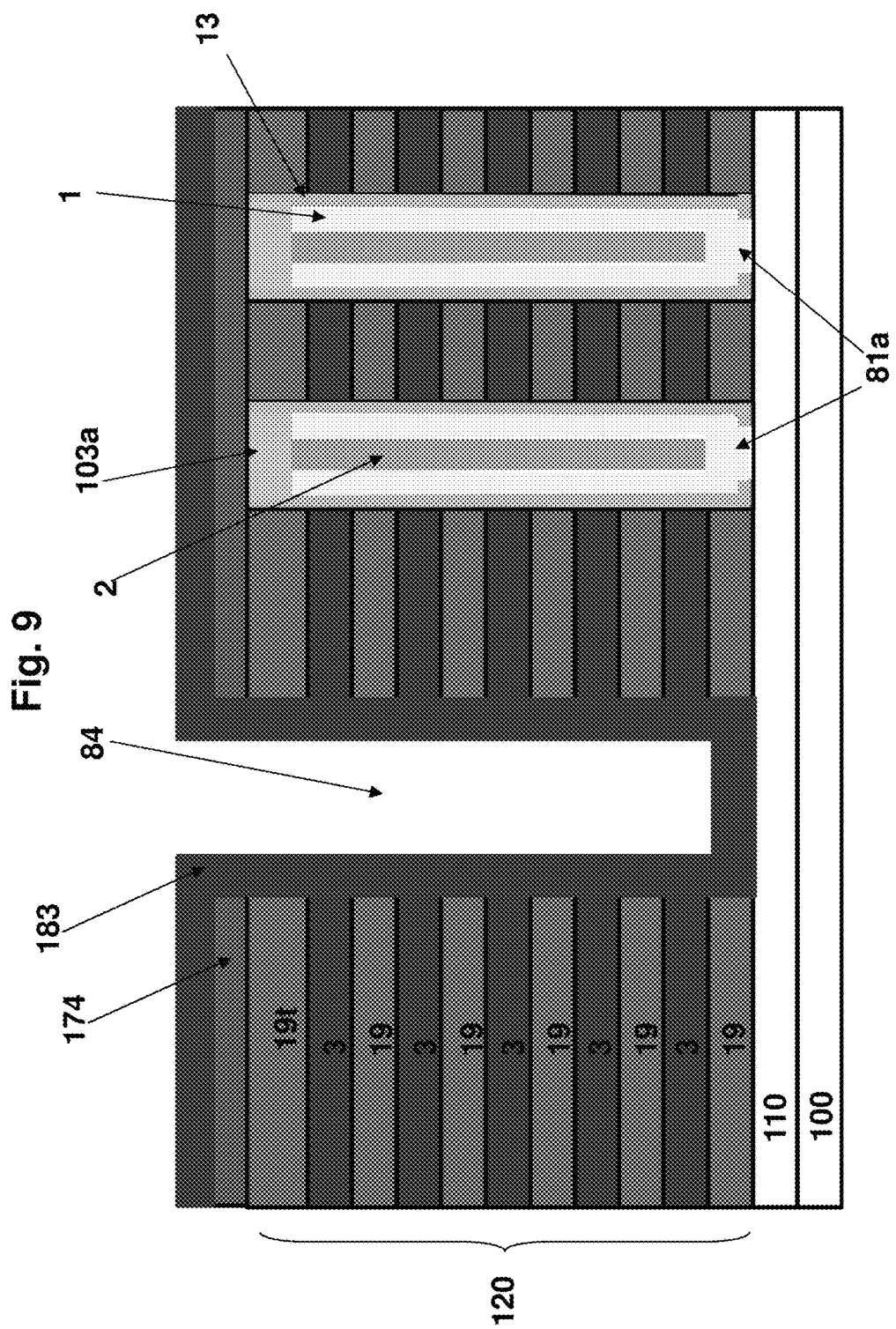

Metal or metal alloy control gate electrodes 3 are then formed in the back side recesses 182 through the back side openings 84, as shown in FIG. 9. A portion 183 of the metal or metal alloy control gate material partially or fully fills the back side openings (e.g., trenches) 84 and is located over layer 174. The control gate electrode 3 material may comprise any suitable materials described above. For example, the material may comprise a TiN liner or barrier layer described above and tungsten gate material 3. If the blocking dielectric layer 7 is formed the back side recesses 182 through the back side opening, then the control gate electrodes 3 are formed over the blocking dielectric layer 7 in the back side recesses 182.

Figure 10:
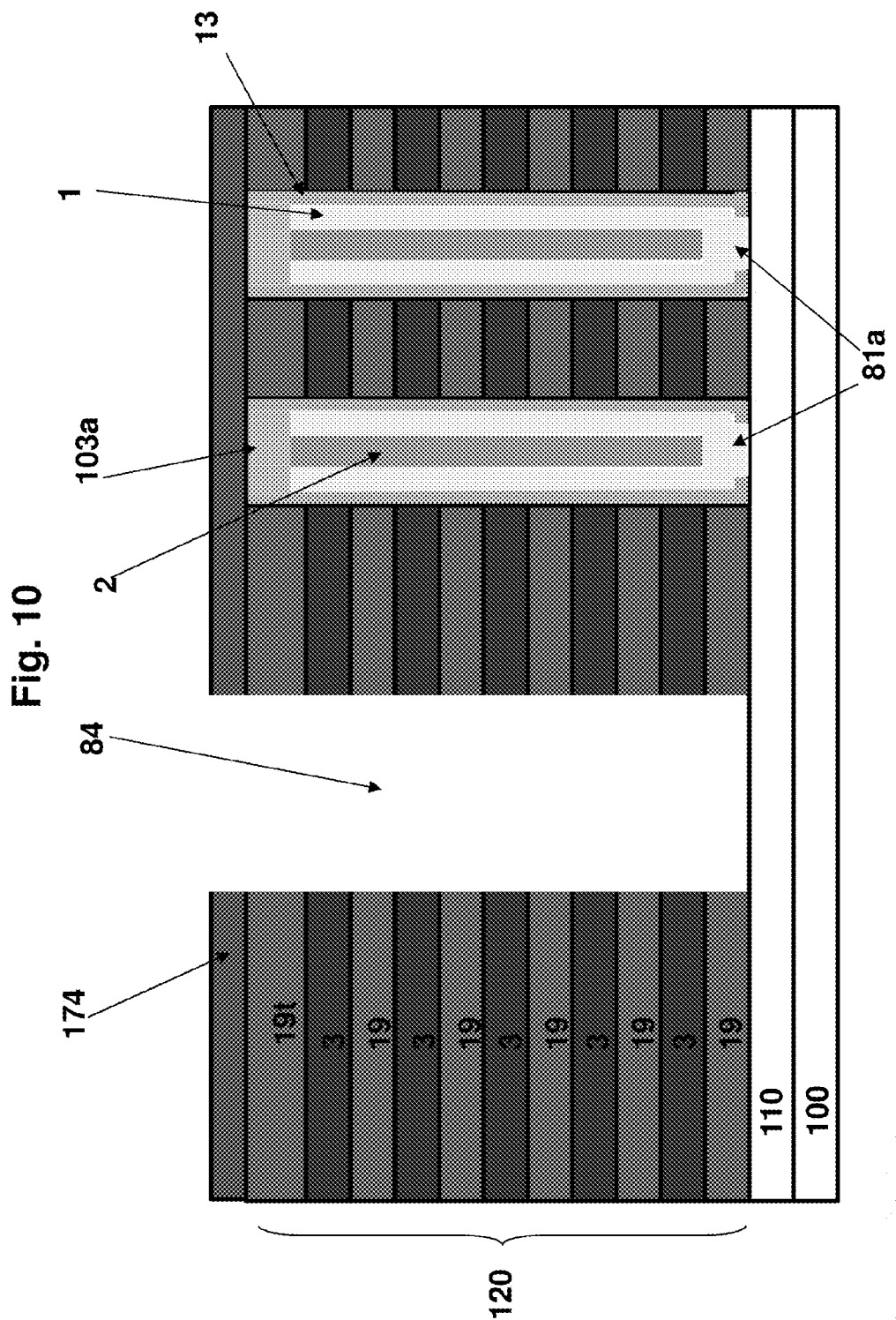

Then, as shown in FIG. 10, the portion 183 of the metal or metal alloy control gate material is removed by anisotropic etching from the back side openings (e.g., trenches) 84 and from over layer 174 without removing the control gate electrodes 3 to complete the formation of the control gate electrodes 3. The select gate electrodes (not shown in FIG. 10 for clarity) may be formed above and below the control gate electrodes 3 at the same time or during a different step.

Figure 11:
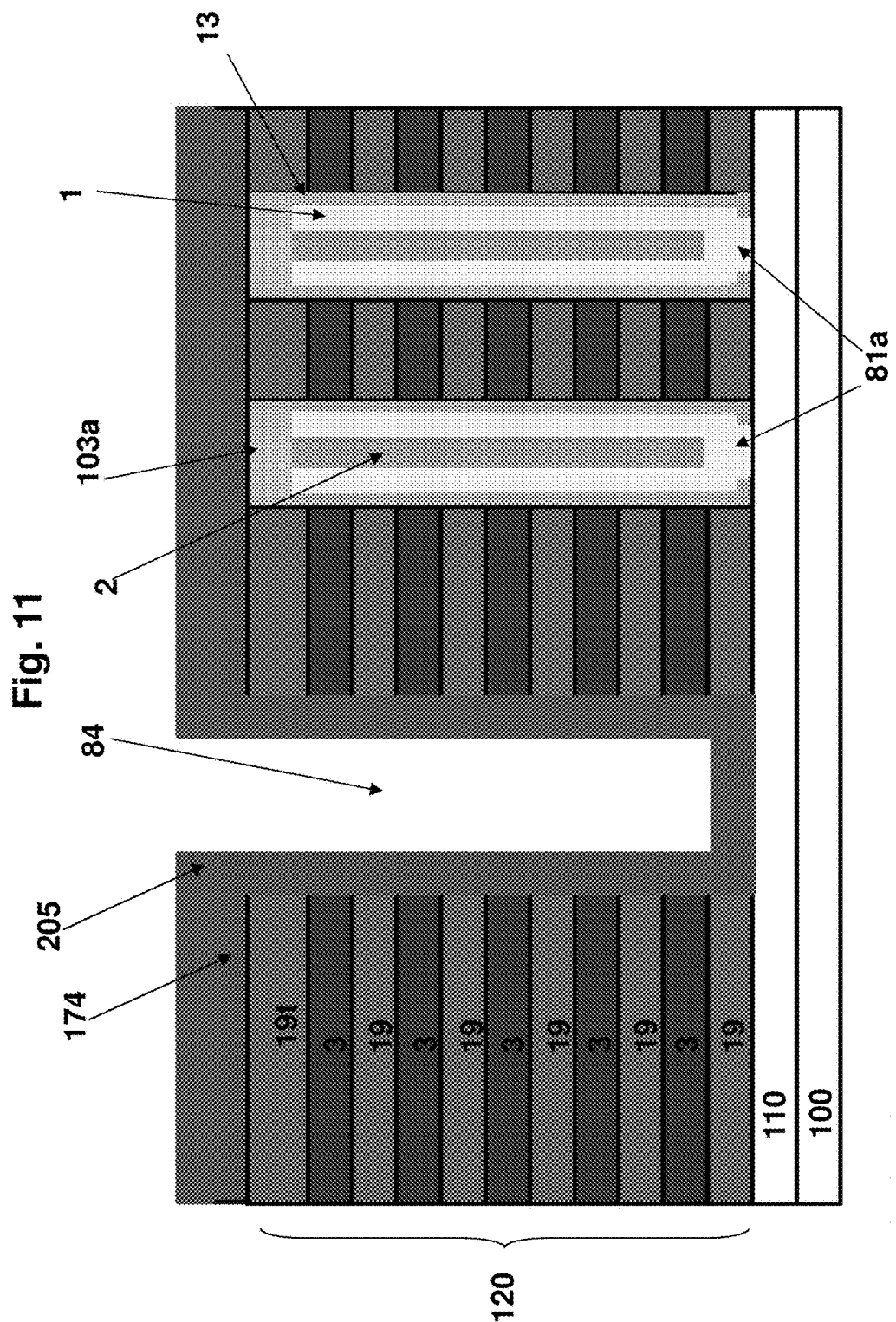
Figure 12:
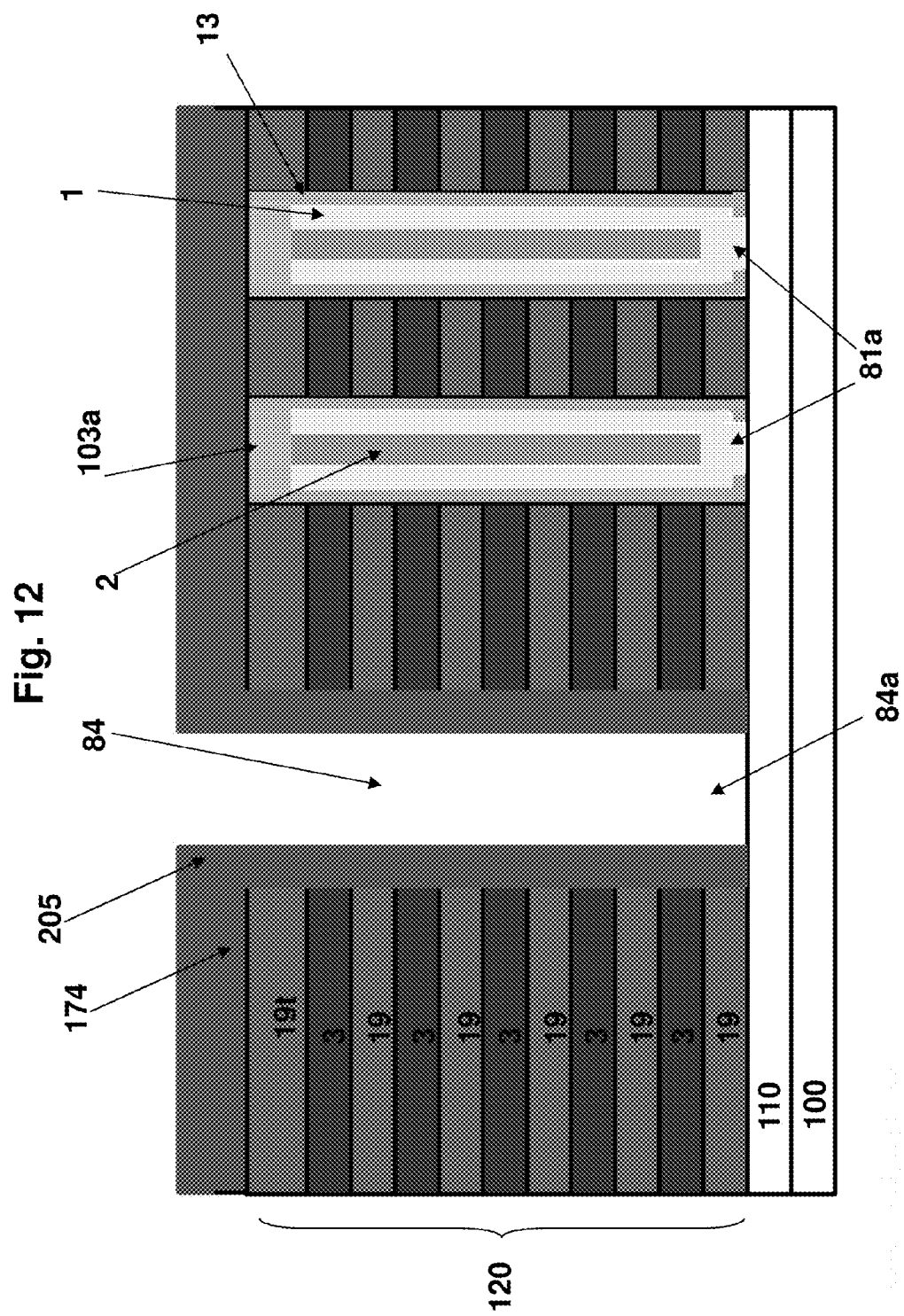

The insulating layer 205, such as a silicon oxide layer, is formed on sidewalls and bottom of the back side trenches 84, as shown in FIG. 11. Layer 205 is also formed over layer 174. The insulating layer 205 is then removed from the bottom 84a of the back side trench 84 by anisotropic etching (e.g., by RIE spacer etch) without removing the insulating layer from the sidewalls of the trench 84, as shown in FIG. 12. This etching step exposes p-well 110 through the bottom 84a of the trench 84.

Figure 13:
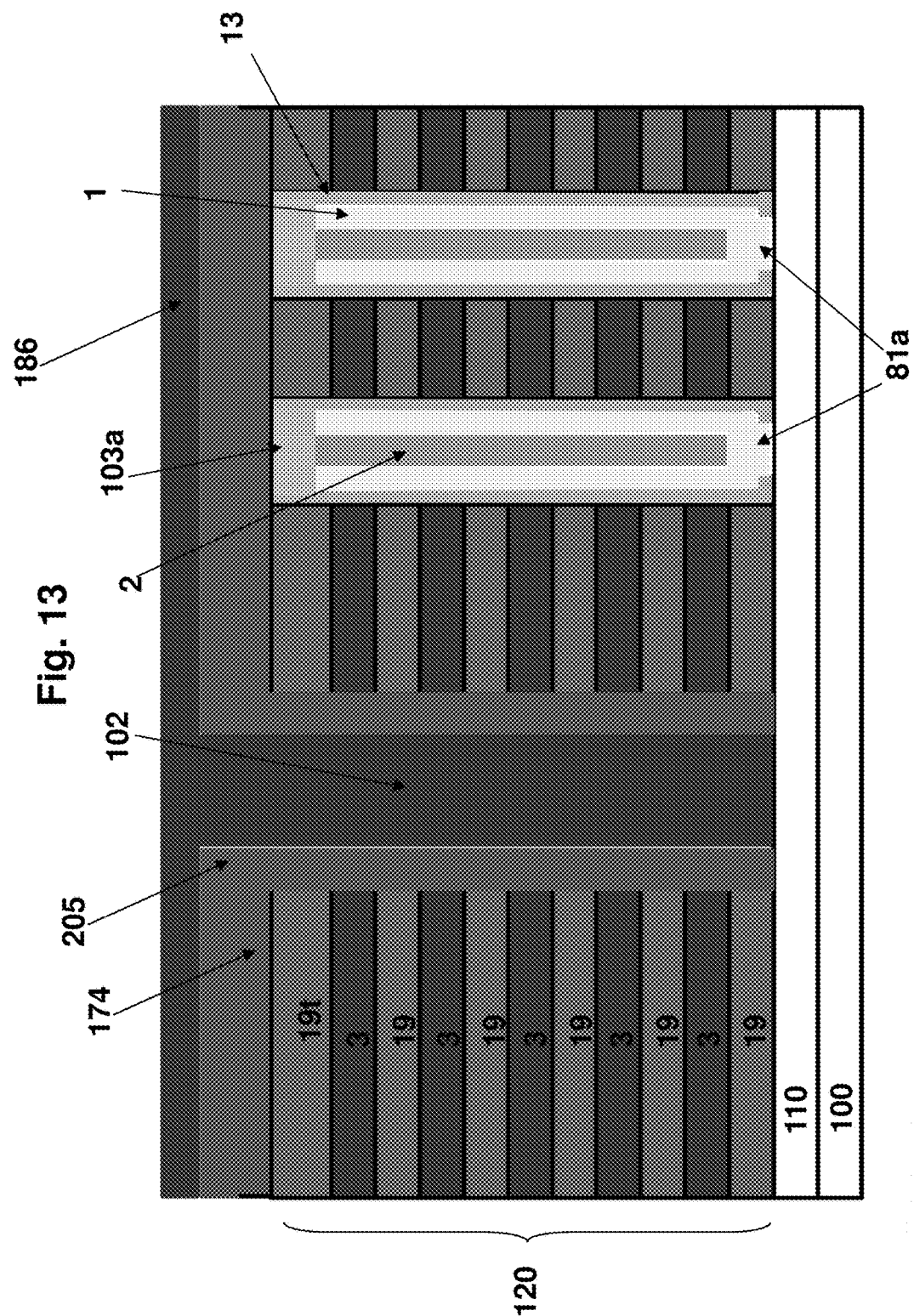

The source electrode 102 is then formed in the back side trench 84 in contact with the source region in the p-well 110 in the substrate 100, as shown in FIG. 13. The source electrode 102 may be formed by depositing any suitable metal or metal alloy layers, such as TiN, ruthenium, and/or tungsten over layer 205 in the trenches 84. A portion 186 of the source electrode material located over the device is removed by CMP or etching to leave the source electrode 102 in the dielectrically insulated trenches 84, as shown in FIG. 14.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A monolithic three dimensional NAND string, comprising:
   a semiconductor channel, at least one end part of the semiconductor channel extending substantially perpendicular to a major surface of a substrate;
   a plurality of control gate electrodes extending substantially parallel to the major surface of the substrate, wherein the plurality of control gate electrodes comprise at least a first control gate electrode located in a first device level and a second control gate electrode located in a second device level located over the major surface of the substrate and below the first device level, wherein the first control gate electrode is separated from the second control gate electrode by an insulating layer located between the first and second control gates;
   a blocking dielectric located adjacent the plurality of control gate electrodes and including a first blocking dielectric comprising $Al_2O_3$ doped with fluorine and a second blocking dielectric comprising silicon oxide doped with fluorine;
   at least one charge storage region located adjacent the blocking dielectric; and
   a tunnel dielectric located between the at least one charge storage region and the semiconductor channel, wherein the tunnel dielectric is not doped with fluorine.

2. The monolithic three dimensional NAND string of claim 1, wherein the fluorine passivates at least one surface of the at least one of the semiconductor channel or blocking dielectric.

3. The monolithic three dimensional NAND string of claim 1, wherein the semiconductor channel has a fluorine concentration in a range of 0.1 atomic % to 5 atomic %.

4. The monolithic three dimensional NAND string of claim 1, wherein the semiconductor channel has a fluorine concentration in a range of $1 \times 10^{17}$ cm$^{-3}$ to $1 \times 10^{21}$ cm$^{-3}$.

5. A device comprising an array of monolithic three dimensional NAND strings including multiple instances of the monolithic three dimensional NAND string of claim 1, wherein:
   the substrate comprises a silicon substrate;
   each of the multiple instances of the monolithic three dimensional NAND string is located over the silicon substrate;
   at least one memory cell in a first device level of each instance of the three dimensional array of NAND strings is located over another memory cell in a second device level of the instance of the three dimensional array of NAND strings; and
   the device further comprises an integrated circuit comprising a driver circuit for the array of monolithic three dimensional NAND strings located thereon.

6. The monolithic three dimensional NAND string of claim 1, wherein the semiconductor channel is doped with fluorine.

7. The monolithic three dimensional NAND string of claim 1, wherein each of the first and second blocking dielectrics has a fluorine concentration that is in a range of 0.1 atomic % to 5 atomic %.

8. The monolithic three dimensional NAND string of claim 1, wherein each of the first and second blocking dielectrics has a fluorine concentration that in a range of $1 \times 10^{17}$ cm$^{-3}$ to $1 \times 10^{21}$ cm$^{-3}$.

9. The monolithic three dimensional NAND string of claim 1, wherein the at least one charge storage region comprises silicon nitride.

10. The monolithic three-dimensional NAND string of claim 1, wherein the semiconductor channel is not doped with fluorine.

11. The monolithic three-dimensional NAND string of claim 1, wherein the at least one charge storage region is:
   a continuous layer of silicon nitride that extends through each of the plurality of control gate electrodes; or
   a plurality of discrete silicon nitride portions that are located at a level of a respective one of the plurality of control gate electrodes.

12. The monolithic three dimensional NAND string of claim 1, wherein the first blocking dielectric directly contacts the plurality of control gate electrodes.

* * * * *